United States Patent [19]

Baum et al.

[11] Patent Number: 5,246,745
[45] Date of Patent: Sep. 21, 1993

[54] LASER-INDUCED CHEMICAL VAPOR DEPOSITION OF THIN-FILM CONDUCTORS

[75] Inventors: Thomas H. Baum, San Jose; Paul B. Comita, Menlo Park, both of Calif.; John R. Lankard Sr., Mahopac, N.Y.; Thoams F. Redmond, Poughkeepsie, N.Y.; Thomas A. Wassick, Wappingers Falls, N.Y.; Robert L. Jackson, San Jose, Calif.

[73] Assignee: International Business machines Corporation, Armonk, N.Y.

[21] Appl. No.: 812,686

[22] Filed: Dec. 23, 1991

[51] Int. Cl.$^5$ .......................... B05D 3/06; B05D 5/12
[52] U.S. Cl. ..................................... 427/586; 427/585; 427/96; 427/140; 427/252
[58] Field of Search ................ 427/96, 53.1, 252, 140, 427/585, 586

[56] References Cited

U.S. PATENT DOCUMENTS 4,711,790 12/1987 Morishige .............................. 427/10
4,880,959 11/1989 Baum et al. ..................... 219/121.85

OTHER PUBLICATIONS

"Laser Chemcial Vapor Deposition of Gold, The Effect of Organometallic Structure," J. Electrochemical Soc.; vol. 143, No. 10, 1987.
"Graded Step Crossing by Laser Chemical Vapor Deposition," by P. A. Moskowitz; IBM Technical Disclosure Bulletin; vol. 27, No. 3, Aug. 1984.
"Kinetics of laser-induced chemical vapor deposition of gold," by T. T. Kodas, T. H. Baum and P. B. Comita; J. Appl. Phys. 62 (1), Jul. 1, 1987.
"Laser chemcial vapor deposition: A technique for selective area deposition", S. D. Allen; J. Appl. Phys. 52(11), Nov. 1991.
"Laser chemcial vapor deposition of gold"; Thomas H. Baum and Carol R. Jones; Appl. Phys. Lett. 47(5); Sep. 1 1985 pp. 538-540.
"Laser chemcial vapor deposition of gold: Part II"; Thomas Baum, Carol R. Jones; J. Vac. Sci. Technol. B4(5), Sep./Oct. 1986; pp. 1187-1191.
"High-resolution electron-beam induced deposition"; H. W. P. Koops, R. Weiel and D. P. Kern; J. Vac. Sc. Technol. B6(1); Jan./Feb. 1988; pp. 477-481.
"Projection printing of gold micropatterns by photochemical decompositin"; Thomas H. Baum & Ernesto E. Marinero; Appl. Phys. Lett. 49(18); pp. 1213-1215.
"Gold Crystal Growth By Photothermal Laser-Induced Chemical Vapor Deposition"; Toivo T. Kodas, T. H. Baum & Paul B. Comita; Journal of Crystal Growth 87 (1988) 378-382.

Primary Examiner—Shrive Beck
Assistant Examiner—David M. Maidrana
Attorney, Agent, or Firm—Whitham & Marhoefer

[57] ABSTRACT

Control of the local environment during pulsed laser removal of thin film circuit metallurgy is used to change the nature of the top surfaces. Interconnecting such laser treated surfaces with LCVD films results in different growth morphologies, dependent on the nature of the surface created and the debris generated during the ablation process. Flowing helium across the surface during the ablation process results in improved growth morphologies for the same laser writing conditions. A low power laser scan is used to induce metal deposition on the substrate without surface damage. This is followed by several scans at an intermediate laser power to deposit the desired thickness of metal (e.g., about 8 μm). Lastly, a high power laser scan is used, either at the points of intersection between the existing metallurgy and the metal repair or across the entire deposit area. Thermal spreading or blooming is reduced by modulating the intensity of the laser source.

7 Claims, No Drawings

LASER-INDUCED CHEMICAL VAPOR DEPOSITION OF THIN-FILM CONDUCTORS

BACKGROUND OF THE INVENTION

Field of the Invention

The present invention generally describes an improved method for laser-induced chemical vapor deposition (LCVD) of thin-film conductors on dielectric substrates.

Interconnection and/or repair of thin-film circuits is commonly required in the manufacture of integrated circuits, integrated circuit modules, and printed circuit boards. For example, open defects may occur during the manufacture of thin-film circuitry on an integrated circuit, packaging module, or printed circuit board, or an engineering change must be made. To repair these defects or make changes, it becomes necessary to interconnect separated circuit lines across an open region. This can be accomplished by depositing additional metallurgy in the form of a thin metal film deposited on the same substrate as the existing circuitry to make a change or complete the defective circuit.

LCVD of materials is a modification of conventional chemical vapor deposition (CVD), in which a focused laser is utilized as a localized heat source. An organometallic material, adsorbed or colliding at the laser heated surface is pyrolyzed to metal and liberates volatile reaction products. The actual surface temperature profile is defined by the laser power, the focal spot size, the optical and thermal properties of the substrate and of the deposited metal. The presence of metal structures on the substrate must be accounted for when using laser-driven pyrolytic techniques because they can substantially alter the surface temperature profile by thermal conduction.

Another aspect of LCVD is the metal precursor which is being used. The organometallic precursor must be volatile, easily pyrolyzed to high purity, conducting metal and decomposed at temperatures which will not damage the substrate surface. This is especially true for thermally sensitive materials such as polymers. Dimethyl gold ($\beta$-diketonates) have been synthesized and successfully used to deposit high purity, conducting gold lines. The requirements for the repair of electrical opens are quite strict; the repair must be of good electrical integrity, be reliable to electrical and environmental stressing, be able to withstand subsequent chemical and physical processing and be of comparable dimensions to the existing metallurgy. LCVD gold films have been found to meet the above requirements due to the deposit's high purity, low resistivity and chemical inertness.

Laser-induced chemical deposition of gold and other metal conductors for forming and repairing thin-film conductors is described in further detail in the following publications and patents:

U.S. Pat. No. 4,880,959 to Baum et al.; "Laser chemical vapor deposition: A technique for selective area deposition" by S. D. Allen, Center for Laser Studies, University of Southern California, Jul. 17, 1981, *J. Appl. Phys.* 52(11), November 1981, pages 6501–6505, American Institute of Physics; "Laser chemical vapor deposition of gold" by Thomas H. Baum and Carol R. Jones, IBM Research Laboratory San Jose, Calif., Jun. 17, 1985, *Appl. Phys. Lett* 47(5), Sep. 1, 1985, pages 538–540, 1988 1985 American Institute of Physics; "High-resolution electron-beam induced deposition" by H. W. P. Koops, R. Weiel, D. P. Kern and T. H. Baum, IBM Thomas J. Watson Research Center, Yorktown Heights, N.Y., Oct. 20, 1987, J. Vac. Sci. Technol. B6(1). Jan./Feb. 1988, pages 477–481, 1988 American Vacuum Society; "Gold Crystal Growth by Photothermal Laser-Induced Chemical Vapor Deposition" by Toivo T. Kodas, Thomas H. Baum and Paul B. Comita, IBM Almaden Research Center, San Jose, Calif., Sep. 17, 1987, Journal of Crystal Growth 87, 1988, pages 378–382; "Kinetics of laser-induced chemical vapor deposition of gold" by T. T. Kodas, T. H. Baum and P. B. Comita, IBM Almaden Research Center, San Jose, Calif., Feb. 24, 1987, *J. Appl. Phys.* 62(1) Jul. 1, 1987, pages 281–286, 1987 American Institute of Physics; "Projection printing of gold micropatterns by photochemical decomposition" by Thomas H. Baum and Ernesto E. Marinero, IBM Almaden Research Center, San Jose, Calif., Sep. 9, 1986, *Appl. Phys. Lett.* 49(18), Nov. 3, 1986, pages 1213–1215, 1986 American Institute of Physics; and "Laser chemical vapor deposition of gold: Part II" by Thomas H. Baum, IBM Almaden Research Center, San Jose, Calif., Jun. 23, 1986, *J. Vac. Sci. Technol.* B4(5), Sep./Oct. 1986, pages 1187–1191, 1986 American Vacuum Society.

SUMMARY OF THE INVENTION

For LCVD repair work and for making engineering changes (EC) by LCVD deposition of discrete EC conductors between EC pads or similar structures, dimethyl gold (trifluoroacetylacetonate) complex, Me$_2$Au(tfac) is a satisfactory precursor material. This material is a white, volatile solid with a melting point ($T_m$) of 40° C. and an ambient vapor pressure of 40 mT.

Laser-induced deposition of gold can be achieved with the TEM$_{\infty}$ mode of an argon ion laser operating at 514 nm or other wavelengths. The beam is expanded (typically 3X), collimated with a telescope and focused through a microscope objective (0.2 NA). The measured beam diameter is approximately 5 $\mu$m at the 1/e intensity points and has a gaussian intensity distribution. Larger beam diameters (up to 20 $\mu$m) can also be used, and have proven to provide superior deposit quality under certain ranges of laser and scan conditions.

Prior to repair of the open defects, the line ends of the circuit to be repaired are preferably laser ablated as described in aforementioned U.S. Pat. No. 4,880,959 assigned to the assignee of this invention and which is incorporated herein by reference. With respect to the claims in this invention, control of the local environment during pulsed laser removal of thin film circuit metallurgy or the top surface insulator is used to change the nature of the surfaces by removal of the top layers and hence change the interface to the LCVD deposit. The top surface removed can be process debris, metal oxide from processing and handling of metallurgy in ambient air environment, or insulator or dielectric placed there in order to purposefully passivate the metallurgy. Connecting to such laser-treated surfaces with LCVD films results in different growth morphologies, dependent on the nature of the surface created and the debris generated during the ablation process. This pretreatment is valuable when depositing over a non-uniform structure or material site that have differing nucleation and growth thresholds for deposition. The site may be prepared in such a way that debris creates preferred nucleation and growth sites on the material, reducing its threshold for deposition. For example, one side of a gap in a conductor to be repaired may be ablated in a helium atmosphere and the other in air. In another case, the site ablated first shows preferential growth from debris generated during subsequent ablations. Flowing helium across the surface during the ablation process, or using a static helium curtain, results in improved growth morphologies for subsequent laser writing or other laser processing. In a typical repair sequence, a low power laser scan is used to induce metal deposition on the substrate without surface damage. This is especially true of materials such as polymers where the presence of this initial base layer enhances the thermal heat loss characteristics of the surface, and thus protects the top surface from the heat generated by subsequent high power laser scans. The initial scan is followed by several scans at an intermediate laser power to deposit the desired thickness of metal (e.g., about 8 μm). Lastly, a high power laser scan is used, either at the points of intersection between the existing metallurgy and the laser-deposited metal repair, or across the entire deposited area.

Increases in the scan speed used during LCVD, at constant, or near constant laser power, produce deposits with finer grained microstructures, especially when depositing over metal lines. Experiments have revealed that increasing the scan speeds in various steps from 5.0 μm/sec to 25 μm/sec produces a reduction in the size of the grains deposited. This improved microstructure provides better control of the topography of the deposit, as well as increasing the contact area available for both adhesion and electrical contact to the existing metallurgy.

The LCVD conditions required to produce high quality deposits on various materials is dependent on the thermal and optical properties of the substrate, as well as the properties of the LCVD precursor. Nonetheless, useful ranges of laser powers and scan speeds have been established which provide good deposits on different substrate materials. The ranges for argon ion laser operates at 514 μm with a 5 μm spot size are summarized below.

| Material | Power Range | Scan Speed | #Scans |
|---|---|---|---|
| Polyimides | 0.5-150 mW | 1.0-25.0 μm/sec | 4-20 |
| Glass-Ceramic | 250-1000 mW | 5.0-25.0 μm/sec | 1-12 |
| Alumina Ceramics | 350-2000 mW | 5.0-25.0 μm/sec | 1-12 |

These processing conditions are not necessarily limited to those listed, but conditions in these ranges can be used to tailor a repair or deposit to a specific set of characteristics or requirements. With this approach, open defects can be consistently repaired in the manufacturing of substrates with thin film conductors or dielectrics.

In some cases, the deposit spreads onto existing metallurgy for some distance away from the repair site. In accordance with another aspect of this invention, thermal spreading of the deposited metal (blooming) is reduced by modulating the intensity of the laser source in a periodic fashion. A periodic heat source, such as a focused laser beam absorbed at a surface, with linear heat transfer down a line (or rod with small cross-section) will produce a temperature rise of the surface that oscillates with time. Using a simplifying assumption that heat transfer occurs linearly through the existing conductor, and neglecting the effects of the underlying substrate, the equation that describes this temperature as a function of distance from the modulated heat source is similar in form to a damped harmonic oscillator, namely:

$$v = \sum_{n=0}^{\infty} A_n e^{-(\omega/2k)^{\frac{1}{2}}x} \cos(n\omega t - (\omega/2k)^{\frac{1}{2}}x + \epsilon_n)$$

where
  $\omega$ is the heat modulating frequency
  $k$ is the thermal diffusivity, and
  $x$ is the distance from the heat source At large distances x from the source, the oscillations are damped, resulting in a steady state temperature. The equilibrium temperature away from the source will be that due to the average power of the laser source, (i.e. one half that due to the power of the unmodulated laser source for a 50% on-off duty cycle). Hence, the surface temperature rise is substantially reduced at locations sufficiently far from the beam spot. The oscillations are damped for:

$$\left(\frac{\omega}{2k}\right)^{\frac{1}{2}} >> 1/x$$

For thermal diffusivities in the range of copper and nickel, $\omega > 40$ KHz. This number is much higher than the actual physical realization, because thermal damping by the underlying substrate is not taken into account by the above analysis. The significance of the above treatment is that it predicts that the average temperature due to heat transfer down a line will be reduced by increasing the heat source modulation frequency for a constant thermal diffusivity. The consequence of this for laser-induced deposition can be explained as follows. In order to observe a thermal chemical reaction during the scanning period, a critical temperature must be reached. Because the temperature profile is altered by laser intensity modulation, the critical temperature for deposition during the scan time will be closer to the heat source, and hence reduce the spreading of the deposit. However, because the damping term is dependent on the distance to the heating source, the critical temperature will still be achieved near the focal spot, with the exception that the temperature will be achieved only 50% of the time, i.e. during the on-cycle. The effect of modulating the laser source is thus substantially different than simply reducing the laser power.

DETAILED DESCRIPTION OF THE INVENTION

The following examples are given solely for purposes of illustration, and are not to be considered limitations of the present invention, many variations of which will occur to those skilled in the art, without departing from the scope of spirit thereof.

EXAMPLE 1

A thin-film circuit repair is made by initially ablating the ends of the thin-film circuits to be joined in accordance with the teachings of U.S. Pat. No. 4,880,959. The site prepared by this ablative process was subjected to a continuous flow of helium during the ablative process. In one example, helium was directed perpendicularly to the substrate carrying the thin-film circuit. In another example the direction of flow was generally parallel to the substrate surface. The results were not affected by the direction of flow. The final repair was made using a conventional LCVD process to form a gold metallization.

Specifically, an open thin-film circuit consisting of 15 μm wide, 9 μm thick lines of a multiple metallurgical stack (Cr/Cu/Ni/Au/Cr) on a polyimide substrate was joined by the following interconnection process. One end of the existing circuit was partially ablated at the open defect site with one pulse from an excimer laser (308 nm) at a fluence of 12.7 J/cm² and a repetition rate of 1 Hz, with helium flow across the surface. This was repeated for the end of the existing circuit at the other end of the open defect site. Gold metal was then deposited by laser chemical vapor deposition from a dimethyl gold β-diketonate complex.

EXAMPLE 2

An open thin-film circuit consisting of 15 μm wide, 10 μm thick lines of a multiple metallurgical stack (Cr/Cu/Ni/Au/Cr) on a polyimide substrate was joined by the following interconnection process. Gold from dimethyl gold hexafluoroacetylacetonate was deposited with the room temperature vapor pressure of the precursor, and a continuous wave argon ion laser with an incident power of 0.1 to 0.175 watt. The technique for reducing the spreading of metal deposits during deposition comprised modulating the intensity of the continuous wave laser beam during the final high power set of scans used in the LCVD open repair process. The frequency of modulation which reduces the spreading of the deposited metal extends from approximately 10 Hz to 750 Hz with a 50% duty cycle. No additional lasers or associated optics are required beyond that for LCVD processes described in the prior art. The only special equipment required is the addition of a suitable chopper or opto-electronic modulator to the optical train. Gold metal is deposited by laser chemical vapor deposition from a dimethyl gold β-diketonate complex. A repair was made to a simulated open defect using the following scan sequence:

|        | Incident Laser Power | Scan Rate  | Number of Passes |
|--------|----------------------|------------|------------------|
| Scan 1 | 5 mW                 | 2 μm/sec   | 2                |
| Scan 2 | 50 mW                | 2 μm/sec   | 2                |
| Scan 3 | 160 mW               | 10 μm/sec  | 4                |

The repair using the above scan sequence was repeated for 3 essentially identical repair sites. In the first sequence the last high-powered scan (Scan 3) was unmodulated, in the second sequence the last high-powered scan was modulated at a 100 Hz modulation frequency, and in the final sequence the last high-powered scan was modulated at a 750 Hz modulation frequency. Compared to spreading for the unmodulated sequence, the sequence modulated at 100 Hz and the sequence modulated at 750 Hz both have a reduced spreading as compared to the unmodulated high-power scan, and the repair site formed at the higher modulation frequency has less spreading than that formed with the lower modulation frequency.

While the invention has been described in terms of specific embodiments, those skilled in the art will recognize that the invention can be practiced with modification within the spirit and scope of the appended claims.

Having thus described our invention, what we claim as new and desire to secure by Letters Patent is as follows:

1. A laser-induced chemical vapor deposition process for interconnecting two points on a thin-film electrical circuit formed on a substrate, comprising the steps of:
    first scanning a laser beam at a low beam intensity along said dielectric surface between said two points to deposit a conductor on said surface extending between said two points by laser-induced chemical vapor deposition;
    next scanning a laser beam at a higher beam intensity between said two points to deposit a conductor extending between said two points by laser-induced chemical vapor deposition from a organometallic precursor; and
    modulating the intensity of said laser beam at said higher beam intensity by alternately blocking said laser beam from said surface and transmitting said laser beam to said surface at a frequency that attenuates the transmission of heat along said thin-film surface generated by said scanning laser.

2. A laser-induced chemical vapor deposition process as in claim 1, wherein said substrate surface is a polyimide material, said beam intensity is varied in range extending from a low beam intensity of 0.5 mW to a high beam intensity of 150 mW and said beam is scanned at a speed that varies in a range between 1.0 μm/sec and 25.0 μm/sec.

3. A laser-induced chemical vapor deposition process as in claim 1, wherein said substrate surface is a glass-ceramic material, said beam intensity is varied in range extending from a low beam intensity of 250 mW to a high beam intensity of 1000 mW and said beam is scanned at a speed that varies in a range between 5.0 μm/sec and 25.0 μm/sec.

4. A laser-induced chemical vapor deposition process as in claim 1, wherein said substrate surface is an alumina ceramic material, said beam intensity is varied in range extending from a low beam intensity of 350 mW to a high beam intensity of 2000 mW and said beam is scanned at a speed that varies in a range between 5.0 μm/sec and 25.0 μm/sec.

5. A laser-induced chemical vapor deposition process for interconnecting two points on a thin-film electrical circuit formed on a polyimide substrate, comprising the steps of:
    first scanning a laser beam at a low beam intensity along a surface on said polyimide substrate between said two points to deposit a conductor on said surface extending between said two points by laser-induced chemical vapor deposition;
    next scanning a laser beam at a higher beam intensity between said two points to deposit a conductor extending between said two points by laser-induced chemical vapor deposition from a organometallic precursor;
    varying the beam intensity in a range extending from a low-beam intensity of 0.5 mW to a high beam intensity of 150 mW; and
    scanning said beam at a speed that varies in a range between 1.0 μm/sec and 25.0 μm/sec.

6. A laser-induced chemical vapor deposition process for interconnecting two points on a thin-film electrical circuit formed on a glass-ceramic substrate, comprising the steps of:
    first scanning a laser beam at a low beam intensity along a surface on said glass-ceramic substrate between said two points to deposit a conductor on said surface extending between said two points by laser-induced chemical vapor deposition;

next scanning a laser beam at a higher beam intensity between said two points to deposit a conductor extending between said two points by laser-induced chemical vapor deposition from a organo-metallic precursor;

varying the beam intensity in a range extending from a low-beam intensity of 250 mW to a high beam intensity of 1000 mW; and scanning said beam at a speed that varies in a range between 5.0 μm/sec and 25.0 μm/sec.

7. A laser-induced chemical vapor deposition process for interconnecting two points on a thin-film electrical circuit formed on a alumina ceramic substrate, comprising the steps of:

first scanning a laser beam at a low beam intensity along a surface on said alumina ceramic substrate between said two points to deposit a conductor on said surface extending between said two points by laser-induced chemical vapor deposition;

next scanning a laser beam at a higher beam intensity between said two points to deposit a conductor extending between said two points by laser-induced chemical vapor deposition from a organo-metallic precursor;

varying the beam intensity in a range extending from a low-beam intensity of 350 mW to a high beam intensity of 2000 mW; and scanning said beam at a speed that varies in a range between 5.0 μm/sec and 25.0 μm/sec.

* * * * *